United States Patent
Djordjevic et al.

(10) Patent No.: US 9,257,814 B1
(45) Date of Patent: Feb. 9, 2016

(54) TEMPERATURE-INSENSITIVE OPTICAL COMPONENT

(71) Applicant: Oracle International Corporation, Redwood City, CA (US)

(72) Inventors: Stevan S. Djordjevic, San Diego, CA (US); Xuezhe Zheng, San Diego, CA (US); Jin Yao, San Diego, CA (US); John E. Cunningham, San Diego, CA (US); Kannan Raj, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/567,239

(22) Filed: Dec. 11, 2014

(51) Int. Cl.
| | |
|---|---|
| H01S 5/10 | (2006.01) |
| H01S 5/024 | (2006.01) |
| G02B 6/26 | (2006.01) |
| H01S 5/30 | (2006.01) |

(52) U.S. Cl.
CPC .............. *H01S 5/1028* (2013.01); *G02B 6/26* (2013.01); *H01S 5/02461* (2013.01); *H01S 5/3013* (2013.01)

(58) Field of Classification Search
CPC . H01S 5/0284; H01S 5/02461; H01S 5/1028; H01S 5/3013
See application file for complete search history.

(56) References Cited

U.S. PATENT DOCUMENTS

| | | | | |
|---|---|---|---|---|
| 4,993,032 A | * | 2/1991 | Bradley | G02B 6/12004 372/20 |
| 5,043,991 A | * | 8/1991 | Bradley | H01S 5/125 372/32 |
| 6,341,138 B1 | * | 1/2002 | Peters | H01S 5/18361 372/96 |
| 2005/0018741 A1 | * | 1/2005 | Nomaguchi | H01S 5/12 372/96 |

OTHER PUBLICATIONS

Bosc et al., "Temperature and polarisation insensitive Bragg gratings realised on silica waveguide on silicon", Electronics Letters, vol. 33, No. 2, Jan. 1997.*
Liu et al., "Condition for the realization of a temperature-insensitive long-period waveguide grating", Optics Letters, vol. 31, pp. 2716-2718, No. 18, Sep. 15, 2006.*

* cited by examiner

*Primary Examiner* — Eric Bolda
(74) *Attorney, Agent, or Firm* — Park, Vaughan, Fleming & Dowler LLP; Steven E. Stupp

(57) ABSTRACT

A hybrid optical source that provides an optical signal having a wavelength is described. This hybrid optical source comprises an optical amplifier (such as a III-V semiconductor optical amplifier) that is butt-coupled or vertically coupled to a silicon-on-insulator (SOI) platform, and which outputs an optical signal. The SOI platform comprises an optical waveguide that conveys the optical signal. A temperature-compensation element included in the optical waveguide compensates for temperature dependence of the indexes of refraction of the optical amplifier and the optical waveguide. In addition, a reflector, included in or in-line with the optical waveguide and after the temperature-compensation element, reflects a portion of the optical signal and transmits another portion of the optical signal that has the wavelength.

20 Claims, 5 Drawing Sheets

TEMPERATURE-INSENSITIVE OPTICAL COMPONENT

BACKGROUND

1. Field

The present disclosure generally relates to the design of an optical component. More specifically, the present disclosure relates to the design of an optical component with reduced temperature sensitivity.

2. Related Art

Optical interconnects or links based on silicon photonics have the potential to alleviate inter-chip communication bottlenecks in high-performance computing systems that include multiple processor chips and memory chips. This is because, relative to electrical interconnects, optical interconnects offer significantly improved: bandwidth, density, power consumption, latency, and range.

In order to make a very low power (for example, less than 1 pJ/bit) optical interconnect, a power-efficient optical source, such as a semiconductor laser or a laser source, that is compatible with silicon-on-insulator (SOI) platforms is highly desirable. However, silicon cannot efficiently emit light because of the fundamental limitations of its indirect bandgap and relatively high free-carrier absorption. Consequently, one approach for implementing silicon lasers is to integrate discrete III-V semiconductor optical amplifiers with silicon-based optical devices in a hybrid optical source. In these approaches, the III-V semiconductor provides the optical gain (and, thus, the initial light), and the silicon-based optical device provides the cavity feedback necessary for lasing through the use of a tunable ring-resonator-based reflector.

While the availability and low-cost of silicon-based optical devices are advantageous, silicon has a relatively large thermo-optic coefficient (TOC) of $1.8 \cdot 10^{-4}$ $K^{-1}$, which induces a red shift (i.e., to longer wavelengths) of the optical cavity modes and the reflection peak of the reflector with increasing temperature. Because unpredictable temperature fluctuations often occur in devices integrated with power-dissipating CMOS components, the lasing wavelength and the peak-reflection wavelength need to be made independent of temperature (i.e. 'athermal'). However, existing approaches to address this problem are often complicated and expensive. For example, these existing approaches typically involve complicated measurement and feedback loops and/or power-consuming thermal-tuning elements.

Hence, what is needed is an optical source without the problems described above.

SUMMARY

One embodiment of the present disclosure provides an integrated circuit having: a substrate, a buried-oxide layer disposed on the substrate, and a semiconductor layer disposed on the buried-oxide layer. The semiconductor layer comprises an optical waveguide that conveys an optical signal. Moreover, the integrated circuit comprises a temperature-compensation element, optically coupled to the optical waveguide, which compensates for a temperature dependence of indexes of refraction of the optical waveguide. Furthermore, the integrated circuit comprises a reflector, with a peak reflection wavelength having a reduced temperature sensitivity, defined in the semiconductor layer and optically coupled to the temperature-compensation element, which reflects a portion of the optical signal and transmits a remainder of the optical signal.

For example, the reflector may include a grating reflector. This reflector may include a titanium-dioxide cladding layer. Therefore, the reflector may also be temperature-insensitive.

Furthermore, the temperature-compensation element may include a titanium-dioxide optical waveguide.

In some embodiments the integrated circuit comprises a second optical waveguide, defined in the semiconductor layer and optically coupled to the reflector, which conveys the transmitted optical signal.

Additionally, the integrated circuit may include a first taper region between the optical waveguide and the temperature-compensation element, and a second taper region between the temperature-compensation element and the reflector. The first taper region and the second taper region may provide adiabatic optical coupling.

Note that the substrate may include silicon, the buried-oxide layer may include silicon dioxide, and the semiconductor layer may include silicon.

In some embodiments, the optical waveguide has a first edge and a second edge, and the second edge is optically coupled to the temperature-compensation element. Moreover, the integrated circuit may include an optical amplifier, having a third edge and a fourth edge, which provides the optical signal, where the third edge is optically coupled to the first edge. Furthermore, the optical amplifier may include another reflector (such as a mirror) optically coupled to the fourth edge, and the optical amplifier may be disposed on another substrate that is different than the substrate. For example, the other substrate may include a semiconductor. Note that the optical coupling of the third edge and the first edge may include edge coupling and/or vertical coupling. In these embodiments, the temperature-compensation element may compensate for a temperature dependence of an index of refraction of the optical amplifier.

Another embodiment provides a hybrid optical source that comprises the integrated circuit and the optical amplifier.

Another embodiment provides a system that comprises: a processor, memory, and the hybrid optical source.

Another embodiment provides a method for providing an optical signal having a wavelength, which may be performed by the hybrid optical source. During operation, the optical amplifier outputs the optical signal having a range of wavelengths. This optical signal is optically coupled to the integrated circuit. Then, the optical waveguide in the integrated circuit conveys the optical signal. Moreover, the temperature-compensation element in the integrated circuit compensates for the temperature dependence of the indexes of refraction of the optical waveguide and the optical amplifier, where the temperature-compensation element is included in a portion of the optical waveguide. Furthermore, a reflector, included in the optical waveguide and after the temperature-compensation element in the integrated circuit, reflects a portion of the optical signal and transmits another portion of the optical signal, where the portion and the other portion have the wavelength, and the reflector has a peak reflection wavelength with a reduced temperature sensitivity.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
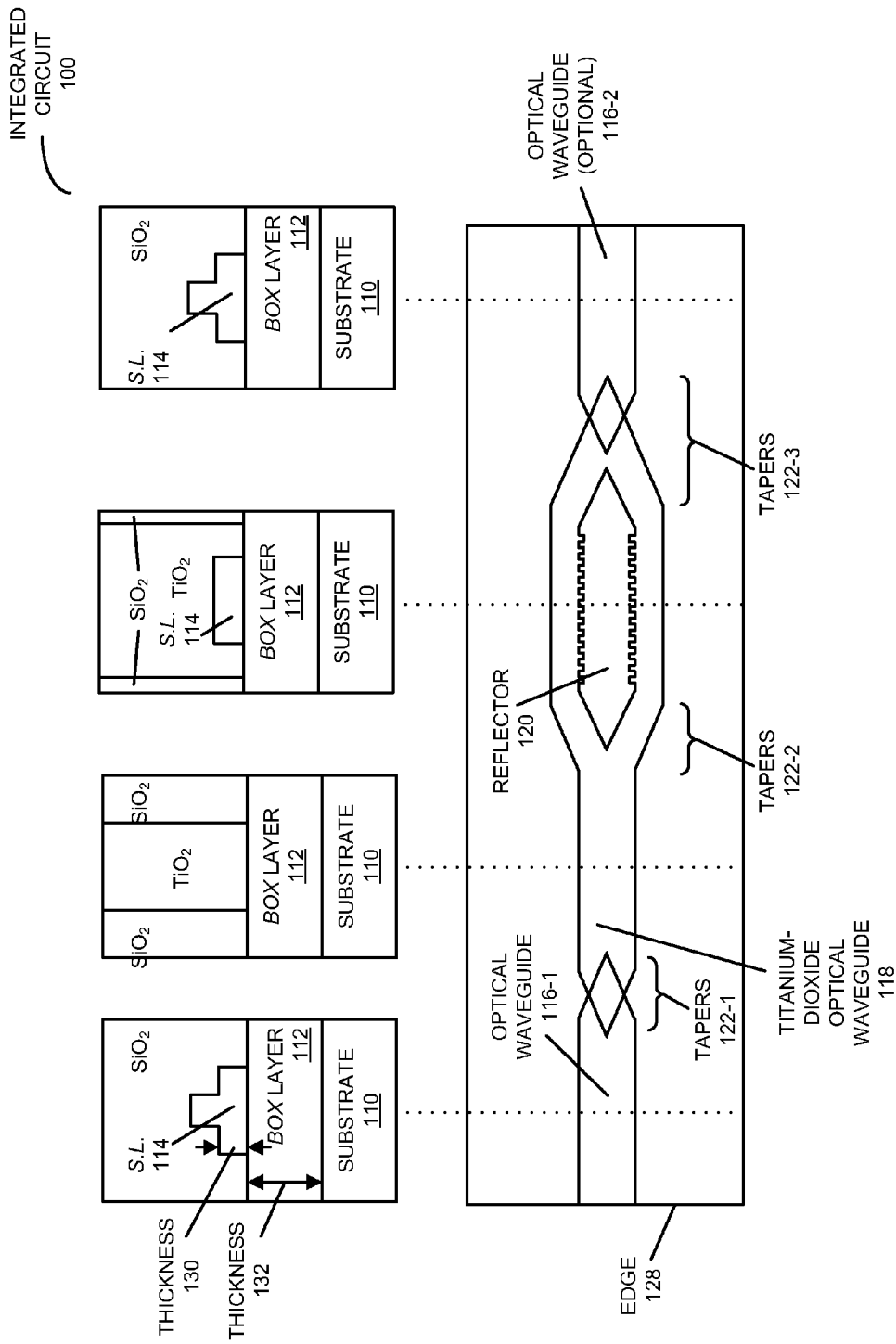
FIG. 1 is a block diagram illustrating an integrated circuit in accordance with an embodiment of the present disclosure.

Embodiments of an integrated circuit, a hybrid optical source that includes the integrated circuit, a system that includes the hybrid optical source, and a method for providing an optical signal having a wavelength are described. This hybrid optical source includes an optical amplifier (such as a III-V semiconductor optical amplifier) that is butt-coupled or vertically coupled to a silicon-on-insulator (SOI) platform, and which outputs an optical signal. The SOI platform includes an optical waveguide that conveys the optical signal. A temperature-compensation element included in the optical waveguide compensates for temperature dependence of the indexes of refraction of the optical amplifier and the optical waveguide. In addition, a reflector, included in or in-line with the optical waveguide and after the temperature-compensation element, reflects a portion of the optical signal and transmits another portion of the optical signal that has the wavelength.

In this way, the hybrid optical source can provide a compact laser source with a narrow lasing linewidth and low power consumption that is compatible with a silicon-on-insulator (SOI) platform. In addition, the lasing wavelength of the hybrid optical source can be easily tuned, and the temperature dependence of the lasing wavelength is significantly reduced (or eliminated) relative to existing laser sources. This hybrid optical source can facilitate high-performance optical interconnects for use in applications such as high-performance computing.

We now describe embodiments of the integrated circuit and the hybrid optical source. The integrated circuit includes an optical waveguide (such as a grating reflector) that can be used for temperature stabilization of the hybrid optical source, such as an external cavity laser source. Global temperature stability of the external cavity may be achieved by canceling out the red-shift (i.e., to larger wavelengths) of a III-V optical waveguide in an optical amplifier (which includes a gain or active medium) and a silicon optical waveguide in the integrated circuit by an equivalent blue-shift (i.e., to shorter wavelengths) of an amorphous titanium-dioxide (TiO$_2$) core optical waveguide (which may be integrated on the silicon integrated circuit). In addition, a temperature-insensitive reflector may be achieved by cancelling the thermo-optic coefficient of a silicon core optical waveguide with that of an amorphous titanium-dioxide upper-cladding (or overcladding) material having a thermo-optic coefficient (TOC) of $-2.15 \cdot 10^{-4} K^{-1}$. More generally, the upper-cladding material may have a large negative thermo-optic coefficient, a medium index of refraction (e.g., an index of refraction equal to 2.420 in the mid-infrared), and/or may be CMOS-compatible. (However, the integrated circuit and/or the hybrid optical source may avoid the use of polymer materials, such as polyurethane acrylates, having a negative TOC, which often suffer from relaxation, photo-aging, moisture absorption and other adverse properties that usually make them unacceptable in CMOS processing.) Therefore, using this passive approach, the hybrid optical source may have significantly reduced temperature dependence (i.e., so-called 'athermal' operation) even in the absence of cooling (and, more generally, temperature control).

FIG. 1 presents a block diagram of integrated circuit 100. This integrated circuit may include: a substrate 110, a buried-oxide layer 112 disposed on substrate 110, and a semiconductor layer (S.L.) 114 disposed on buried-oxide (BOX) layer 112. Moreover, semiconductor layer 114 may include: an optical waveguide 116-1, which conveys an optical signal; a titanium-dioxide optical waveguide 118 optically coupled to optical waveguide 116-1; a reflector 120 optically coupled to titanium-dioxide optical waveguide 118, which reflects a portion of the optical signal and transmits another portion of the optical signal (both of which may have a narrow linewidth that includes a carrier wavelength); and optional optical waveguide 116-2 optically coupled to reflector 120, which conveys the other portion of the optical signal. Furthermore, integrated circuit 100 may include tapers 122 (or taper regions), such as adiabatic inverse taper regions, which may reduce optical coupling losses.

As shown in FIG. 1, note that optical waveguide 116-1 and optional optical waveguide 116-2 may each be silicon-ridge optical waveguides. Moreover, reflector 120 may include a silicon-titanium-dioxide grating reflector with a temperature-insensitive peak reflection wavelength (as described further below with reference to FIG. 3). Similarly, titanium-dioxide optical waveguide 118 may have a blue-shift with increasing temperature (and which, to first order, is targeted to cancel out the red-shift contribution of the silicon optical waveguide 116-1, optional silicon optical waveguide 116-2 and/or, when present, optical amplifier 210 in FIG. 2). Consequently, a hybrid optical source (such as hybrid optical source 200 in FIG. 2) that includes integrated circuit 100 may have significantly reduced or no temperature dependence. (Note that titanium-dioxide optical waveguide 118 is sometimes referred to as a 'temperature-compensation element.') Thus, the impact of components in integrated circuit 100 with positive temperature-dependent indexes of refraction may be offset by the impact of components in integrated circuit 100 with negative temperature-dependent indexes of refraction. (While titanium dioxide is used as an illustrative example, in principle another material may be used in this regard in integrated circuit 100. In particular, integrated circuit 100 may include a CMOS-compatible material having a high, relative to silicon, index of refraction with a negative temperature coefficient or a negative thermo-optic coefficient.) This capability may eliminate laser power shifts associated with an abrupt transfer of power between competing modes (which is sometimes referred to as 'mode-hopping').

Figure 2:
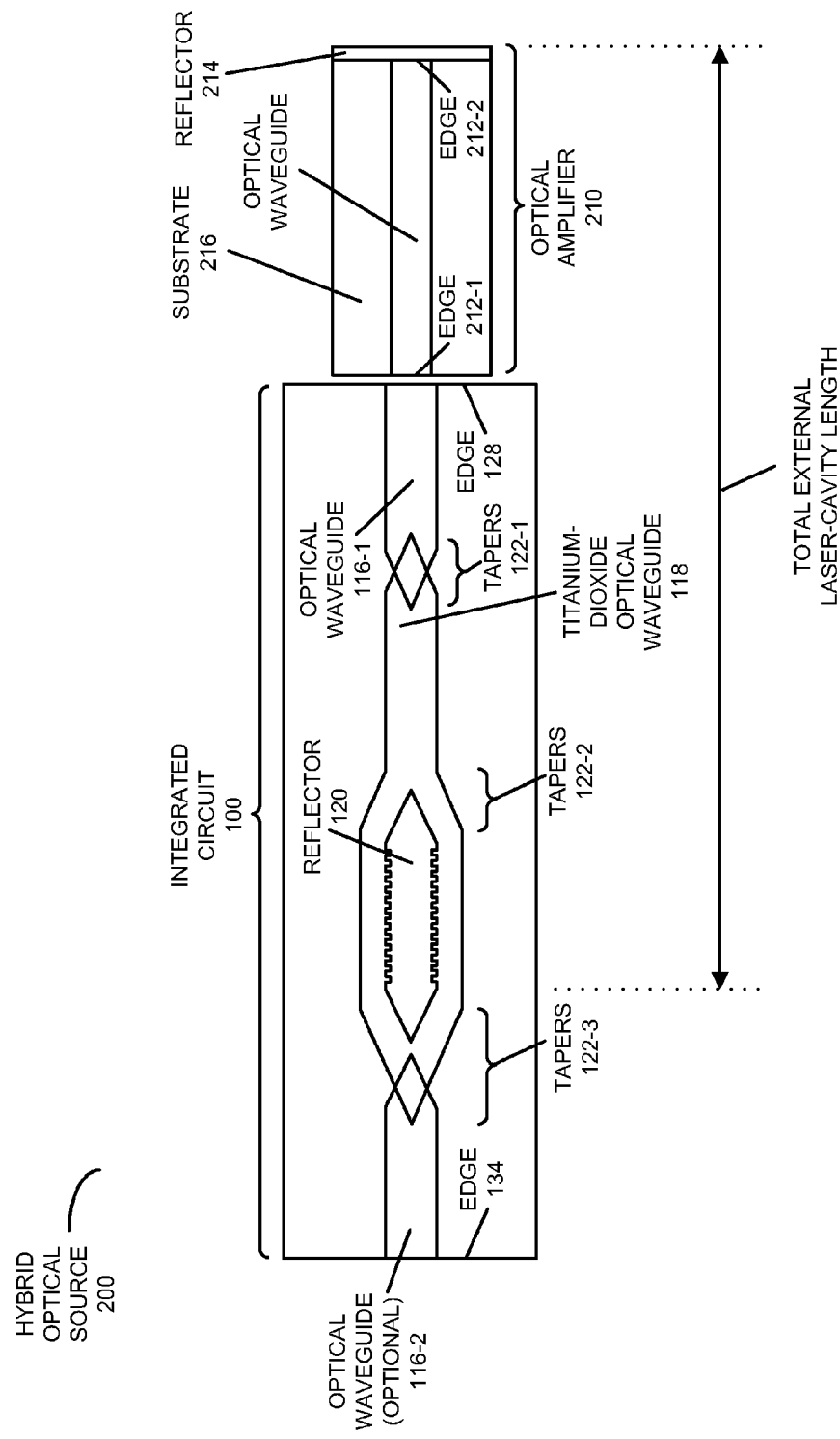
FIG. 2 is a block diagram illustrating a top view of a hybrid optical source that includes the integrated circuit of FIG. 1 in accordance with an embodiment of the present disclosure.

Because reflector 120, as well as the combination of optical waveguide 118, silicon optical waveguide 116-1, optional silicon optical waveguide 116-2 and/or, when present, optical amplifier 210 in FIG. 2, are temperature insensitive, integrated circuit 100 may not need to be tuned. Nonetheless, note that integrated circuit 100 may user thermal or electrical tuning to correct for any residual temperature sensitivity. For example, integrated circuit 100 may include an optional heater (controlled by optional control logic), which thermally tunes integrated circuit 100. (Alternatively or additionally, integrated circuit 100 may be electrically tuned, e.g., using injection tuning.)

FIG. 2 presents a block diagram of a top view of hybrid optical source 200. This hybrid optical source includes optical amplifier 210, having edges 212, which provides the optical signal, where edge 212-1 is optically coupled to edge 128. This optical amplifier may include another reflector 214 (such as a mirror) optically coupled to the edge 212-2, and the optical amplifier may be disposed on substrate 216, which is different than substrate 110 (FIG. 1). For example, the optical coupling of the edges 128 and 212-1 may include: edge coupling (such as facet-to-facet optical coupling), vertical coupling (such as a vertical-angled technique using an angled-facet output on optical amplifier 210 and grating couplers on integrated circuit 100), and/or optical proximity communication (such as using reflective mirrors).

In an exemplary embodiment, substrate 216 may include a III-V semiconductor. (Thus, optical amplifier 210 is sometimes referred to as a 'III-V semiconductor chip' or a 'III-V optical-amplifier chip'.) More generally, optical amplifier 210 may include an active layer having a direct bandgap wavelength that exceeds that of silicon. Note that an optical waveguide on optical amplifier 210 may consist of: an upper cladding layer of lower index-of-refraction material (such as a first type of doped III-V semiconductor, e.g., n-type or p-type indium phosphide), a core layer of higher index-of-refraction material (such as indium gallium arsenide phosphide, aluminum indium gallium arsenide or quantum wells), a bottom cladding layer (such as a second type of doped III-V semiconductor, which may be different than the first type of doped III-V semiconductor, e.g., p-type or n-type indium phosphide), and a substrate (such as an undoped III-V semiconductor, e.g., indium phosphide).

Furthermore, substrate 110 (FIG. 1) may include silicon, buried-oxide layer 112 (FIG. 1) may include silicon dioxide, and semiconductor layer 114 (FIG. 1) may include silicon. Thus, substrate 110 (FIG. 1), buried-oxide layer 112 (FIG. 1) and semiconductor layer 114 (FIG. 1) may constitute an SOI platform. Consequently, integrated circuit 100 (FIG. 1) is sometimes referred to as an SOI integrated circuit.

In an exemplary embodiment, the wavelength of the optical signal is between 1.1-1.7 µm. For example, hybrid optical source 200 may be a hybrid laser providing an optical signal having a fundamental or a carrier wavelength of 1.3 or 1.55 µm. Moreover, semiconductor layer 114 (FIG. 1) may have a thickness 130 (FIG. 1) that is less than 1 µm (such as 0.2-0.5 µm). For example, semiconductor layer 114 (FIG. 1) may have a thickness 130 (FIG. 1) of 0.3 µm. Furthermore, buried-oxide layer 112 (FIG. 1) may have a thickness 132 (FIG. 1) between 0.3 and 3 µm (such as 0.8 µm). Additionally, tapers 122 may have lengths between 20 and 50 µm (such as 40 µm) over which the width of the optical waveguides go from 3-4 µm down to zero. Thus, the angle of tapers 122 may be less than 10°.

During operation, a III-IV gain medium in optical amplifier 210 may provide the initial light (such as an optical signal having a wide range of wavelengths), and reflector 214 (such as a silicon reflector) may provide mode selection. In order for an external optical-cavity laser to operate properly, the intrinsic optical feedback from the semiconductor-chip Fabry-Perot (FP) optical-cavity usually needs to be suppressed, so that it does not interfere with the external feedback. The FP optical-cavity effect of optical amplifier 210 can be reduced by applying an anti-reflection (AR) optical coating to chip facet or edge 212-1. At a minimum, the chip-facet reflectance may be 20 dB less than the external feedback.

Sometimes, even with the AR coating, the residual reflection from the AR-coated FP chip facet limits the stability, output power, and spectral quality of hybrid optical source 200, especially if the hybrid laser is tunable. In order to further reduce the reflection at the chip facet, the combination of an angled optical waveguide and an AR coating can be used to effectively remove most of the feedback from the internal-chip FP optical cavity. This single-angled-facet (SAF) gain chip or optical amplifier provides a superior structure for external optical-cavity lasers, in particular those that are broadband tunable. Therefore, the semiconductor diode in optical amplifier 210 may work as a reflective semiconductor optical amplifier (RSOA), with high reflection (HR) film on the front facet (i.e., reflector 214 at edge 212-2) and anti-reflection (AR) coating on the angled back facet (i.e., edge 212-1). Similarly, for integrated circuit 100, the interface at edge 128 with optical amplifier 210 may also be AR coated to ensure enough external optical feedback into optical amplifier 210. In this way, all the resonator behaviors from the individual chips may be eliminated. Note that integration between optical amplifier 210 and integrated circuit 100 may be achieved either with butt-coupling through a spot-size converter or with vertical coupling via a grating coupler (such as a diffraction grating and, more generally, a surface-normal optical coupler).

Hybrid optical source 200 or a hybrid laser may lase at the external optical-cavity mode selected by integrated circuit 100. For most applications, it is desirable to have a single longitudinal mode (i.e., a single-frequency) laser and/or to be able to adjust the lasing wavelength. In order to accomplish this, a wavelength-selective feedback element in integrated circuit 100 may need to have a narrow bandwidth. As shown in FIG. 2, edge 128 of the coupling optical waveguide 116-1 is optically coupled to optical amplifier 210 (e.g., the laser-diode light source), and edge 134 is the outlet of hybrid optical source 200. This sharp transmission can be converted to a reflection peak, so that the whole silicon feature (e.g., integrated circuit 100) becomes a narrow-band wavelength-selective feedback element to the external optical-cavity laser.

Furthermore, for an incident field in optical waveguide 116-1 at the resonant frequency of the optical cavity, a strong field may build up in the optical cavity. The energy accumulated in the optical cavity may then be coupled back into coupling optical waveguide 116-1 in both directions. The re-injected field in the forward direction may destructively interfere with the incident field and, provided the optical-cavity loss is dominated by optical coupling, at resonance essentially all the power may be reflected.

As noted previously, even though the edges (or the interfaces of integration) are AR coated to eliminate the FP effect, in order for the hybrid laser to achieve the narrowest linewidth, the external optical-cavity mode may still need to be aligned with the reflection wavelength of reflector 120. However, the index of refraction of optical amplifier 210 may drift because of chip temperature variation associated with bias-current changing and device aging. Consequently, wavelength stabilization may still be needed in order to compensate for these temperature-changing factors. As noted previously (and as described further below with reference to FIG. 3), the use a cladding material having an index of refraction with a temperature dependence that is opposite to that of the gain material may minimize or reduce the phase change for the hybrid laser associated with temperature changes (such as those in the external environment). In particular, because the index of refraction of the active region increases with temperature, it has a positive thermal-optical (TO) coefficient of $1.86 \times 10^{-4}$ $K^{-1}$. Titanium dioxide has a negative TO coefficient and is CMOS-compatible. For example, depending on the film quality, the TO coefficient of titanium dioxide can be as low as $-2.15 \cdot 10^{-4}$ $K^{-1}$. Furthermore, because the optical wave travels through both materials (silicon and titanium dioxide), the temperature-induced changes in the index of refraction may largely cancel each other with proper design.

Figure 3:
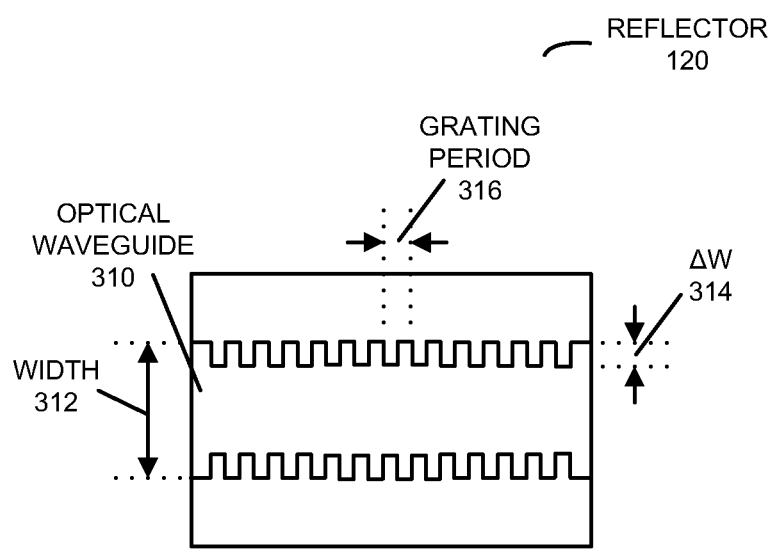
FIG. 3 is a drawing illustrating a top view of a reflector in the integrated circuit of FIG. 1 in accordance with an embodiment of the present disclosure.

We now describe the design of a temperature-insensitive silicon-titanium-dioxide grating reflector. FIG. 3 presents a drawing of a top view of reflector 120 in integrated circuit 100 (FIGS. 1 and 2). This reflector includes an un-modulated silicon optical waveguide 310 having a width (W) 312, a depth of sidewall modulation ($\Delta W$) 314, and a grating period 316. Moreover, reflector 120 may be fabricated on an SOI platform. As shown in FIG. 3, in order to obtain a sufficient confinement factor in the titanium dioxide, the grating may be etched into the silicon slab, covered by the titanium-dioxide upper cladding (or overcladding).

The equivalent TOC of reflector 120, with a core, a buried-oxide layer under cladding and negative TOC overcladding can be expressed as $$\frac{\partial n_{\mathit{eff}}}{\partial T} \approx \Gamma_{core} \cdot \frac{\partial n_{core}}{\partial T} + \Gamma_{overclad} \cdot \frac{\partial n_{overclad}}{\partial T} + \Gamma_{underclad} \cdot \frac{\partial n_{underclad}}{\partial T},$$

where $\Gamma_{core}$ and $\Gamma_{overclad}$ are the percentage of power of an optical mode located within the core (silicon) and the upper cladding, whereas $n_{core}$, $n_{overclad}$ and $n_{underclad}$ are the indexes of refraction of the respective materials. Neglecting the contribution of the buried-oxide layer under cladding (the TOC of silicon dioxide is approximately $10^{-5}$ K$^{-1}$), the condition for temperature-insensitive ('athermal') operation is $$\frac{\Gamma_{overclad}}{\Gamma_{core}} \approx -\frac{\frac{\partial n_{core}}{\partial T}}{\frac{\partial n_{overclad}}{\partial T}}.$$

Thus, 'athermal' operation typically requires that the ratio of the confinement factors and TOCs of the core and the overcladding materials are inversely proportional. Based on calculations of $\Gamma_{core}$ and $\Gamma_{overclad}$, as a function of the silicon slab height and slab width (i.e., width 312), and the equivalent TOC of reflector 120 for the same range of dimensions, with the slab height between 105 and 110 nm the TOC is nearly zero for the slab width between 2 and 5 μm. In these simulations, the thickness of the titanium-dioxide overcladding is 1.1 μm. More generally, etched silicon may be used with a slab height between 80 and 120 nm.

In order to achieve narrow-band operation of the grating reflector, a low-contrast design may be used by employing a sidewall modulation grating. For example, the silicon slab height and slab width may, respectively, be 105 nm and 3 μm. Furthermore, grating period 316 may be 500 nm with a duty cycle of 50%. Based on calculations of the effective index-of-refraction contrast between unmodulated (wide) and modulated (narrowed) sections of the grating reflector as a function of the depth of the sidewall modulation 314, a depth of the sidewall modulation of 150 nm may result in a grating contrast of 0.05%, and a depth of the sidewall modulation of 300 nm may result in a grating contrast of 0.1%. For these two designs with a different number of grating periods, simulated reflection spectra have 3 dB widths of about 2 nm.

We now describe design of the integrated titanium-dioxide-core optical waveguide, which is used to further stabilize the lasing wavelength with respect to temperature and to avoid mode-hopping. In particular, as described previously, the titanium-dioxide-core optical waveguide induces a blue-shift of the lasing wavelength with increasing temperature and cancels out the red-shift contribution of the remaining silicon/III-V semiconductor optical cavity. Based on calculations of the confinement factor in the titanium-dioxide core as a function of its width and height, and the resulting TOC of the titanium-dioxide-core optical waveguide, the height of the titanium-dioxide-core optical waveguide may be 1.1 μm high and the core may be 1.2 μm wide. This design may have a TOC of approximately $-2.06 \times 10^{-4}$ K$^{-1}$. Assuming equal lengths of a III-V optical cavity (for the external laser) and the silicon on-chip optical cavity, the length of the titanium-dioxide cavity needed to balance the red-shift and blue-shift thermal drifts (resulting in a temperature-stable optical cavity) may be approximately the same as the total length of the III-V optical cavity and the silicon on-chip optical cavity.

In summary, this disclosure provides an extremely narrow bandwidth athermal hybrid silicon laser design with a reflector. When integrated with titanium dioxide or another material with a negative TO coefficient, it is possible to minimize temperature-related mode-hopping phenomena, and to realize athermal laser operation without cooling or, more generally, temperature regulation.

Figure 4:
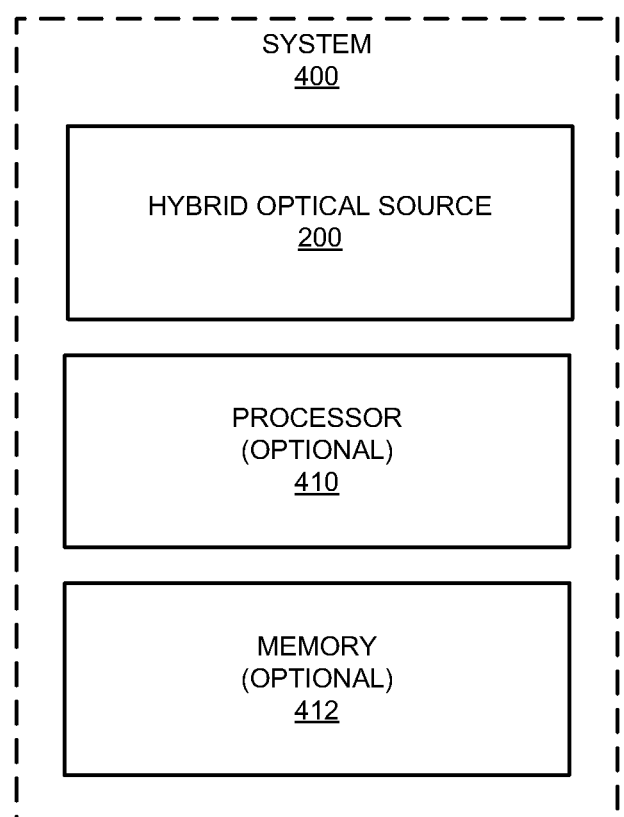
FIG. 4 is a block diagram illustrating a system that includes the hybrid optical source of FIG. 2 in accordance with an embodiment of the present disclosure.

We now describe the system. FIG. 4 presents a block diagram illustrating a system 400 that includes: hybrid optical source 200, an optional processor 410, and optional memory 412.

Note that hybrid optical source 200 can be used as an external optical source to provide optical power to a silicon photonic chip, a silicon-photonic interconnect or link, or an optical fiber. More generally, hybrid optical source 200 can be used in a wide variety of applications, including communications, welding, medicine, etc. Consequently, system 400 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a workstation, a mainframe computer, a blade, an enterprise computer, a data center, a portable-computing device, a tablet computer, a supercomputer, a network-attached-storage (NAS) system, a storage-area-network (SAN) system, and/or another electronic computing device. In some embodiments, the computer system may be at one location or may be distributed over multiple, geographically dispersed locations.

Moreover, the preceding embodiments of the hybrid optical source and/or the system may include fewer components or additional components. Moreover, the substrates may include: a semiconductor die (such as silicon), a ceramic, an organic material and/or glass.

Although the hybrid optical source and the system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. For example, in some embodiments titanium-dioxide optical waveguide 118 in FIGS. 1 and 2 includes a silicon core. In addition, functionality in the preceding embodiments may be implemented more in hardware and less in software, or less in hardware and more in software, as is known in the art.

Note that components in the preceding embodiments of the hybrid optical source and the system may be fabricated using a wide variety of techniques, as is known to one of skill in the art. For example, titanium-dioxide films may be deposited using reactive radio-frequency magnetron sputtering, which is an industry-standard wafer-scale deposition technique. Nonetheless, other deposition techniques may be used.

Figure 5:
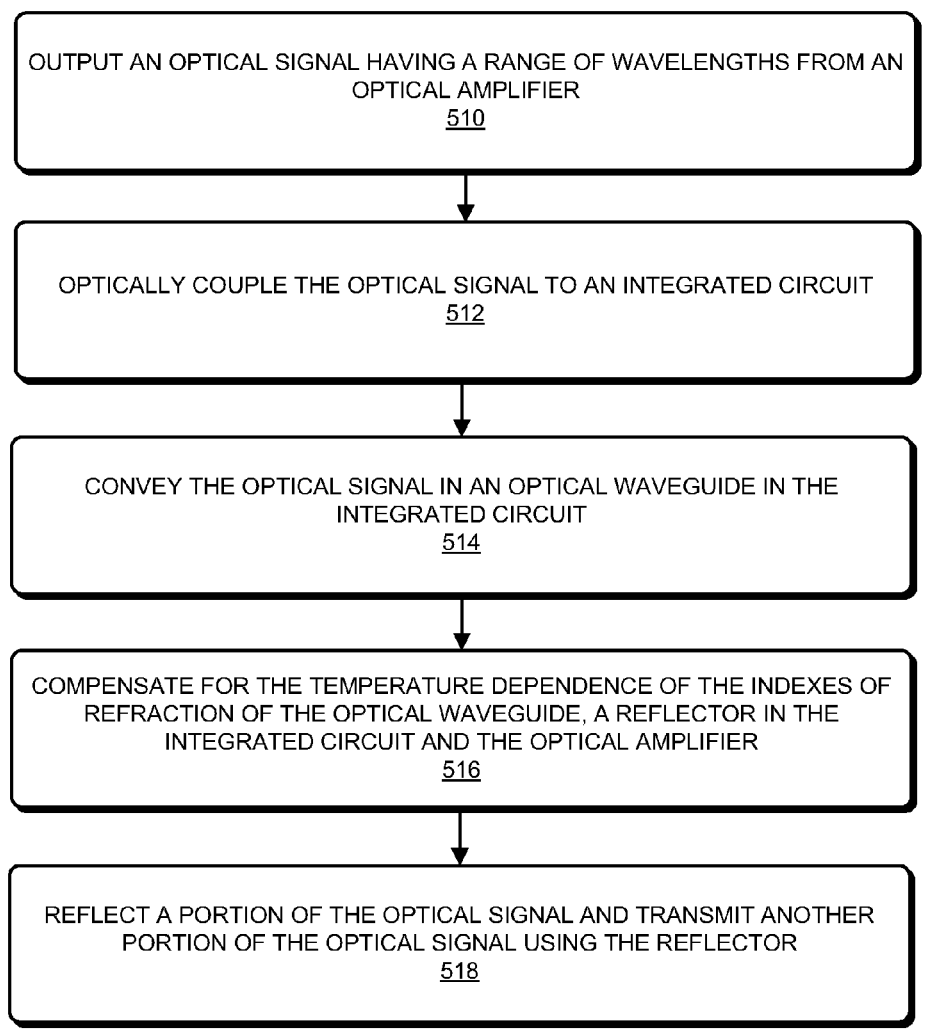
FIG. 5 is a flow diagram illustrating a method for providing an optical signal having a wavelength in accordance with an embodiment of the present disclosure.

We now describe embodiments of the method. FIG. 5 presents a flow diagram illustrating a method 500 for providing an optical signal having a wavelength, which may be performed by hybrid optical source 200 (FIG. 2). During operation, the optical amplifier outputs the optical signal having a range of wavelengths (operation 510). This optical signal is optically coupled to the integrated circuit (operation 512). Then, the optical waveguide in the integrated circuit conveys the optical signal (operation 514). Moreover, a temperature-compensation element in the integrated circuit compensates for the temperature dependence of the indexes of refraction of the optical waveguide and the optical amplifier (operation 516), where the temperature-compensation element is included in a portion of the optical waveguide. Furthermore, a reflector, included in the optical waveguide and after the temperature-compensation element in the integrated circuit, reflects a portion of the optical signal and transmits another portion of the optical signal (operation 518), where the portion and the other portion have the wavelength, and the reflector has a peak reflection wavelength with a reduced temperature sensitivity. Note that the 'temperature-compensation element' may be provided by one or more components in hybrid optical source 200 (FIG. 2) that include titanium dioxide (and, more generally, a material with a negative TOC), such as the titanium-dioxide optical waveguide.

In some embodiments of method 500, there may be additional or fewer operations. Moreover, the order of the operations may be changed, and/or two or more operations may be combined into a single operation.

While some of the preceding embodiments illustrated an optical source in which the working (i.e., the 'lasing') wavelength corresponded to the peak reflection wavelength of the narrow-reflection-peak reflector (if the gain is assumed to be broad over a range of wavelengths), in other embodiments the output of the optical source may include multiple lasing wavelengths (such as a comb optical source). In these other embodiments, the design of the grating reflector may be modified to support the multiple lasing wavelengths.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
   a substrate;
   a buried-oxide layer disposed on the substrate; and
   a semiconductor layer disposed on the buried-oxide layer, wherein the integrated circuit comprises:
      an optical waveguide, defined in the semiconductor layer, configured to convey an optical signal;
      a temperature-compensation element, optically coupled to the optical waveguide, configured to compensate for a temperature dependence of indexes of refraction of the optical waveguide; and
      a reflector, with a peak reflection wavelength having a reduced temperature sensitivity, defined in the semiconductor layer and optically coupled to the temperature-compensation element, configured to reflect a portion of the optical signal and transmit a remainder of the optical signal.

2. The integrated circuit of claim 1, wherein the reflector comprises a grating reflector.

3. The integrated circuit of claim 1, wherein the reflector comprises a titanium-dioxide cladding layer.

4. The integrated circuit of claim 1, wherein the temperature-compensation element comprises a titanium-dioxide optical waveguide.

5. The integrated circuit of claim 1, wherein the integrated circuit further comprises a second optical waveguide, defined in the semiconductor layer and optically coupled to the reflector, configured to convey the transmitted optical signal.

6. The integrated circuit of claim 1, wherein the integrated circuit further comprises a first taper region between the optical waveguide and the temperature-compensation element, and a second taper region between the temperature-compensation element and the reflector.

7. The integrated circuit of claim 6, wherein the first taper region and the second taper region provide adiabatic optical coupling.

8. The integrated circuit of claim 1, wherein the optical waveguide has a first edge and a second edge, and the second edge is optically coupled to the temperature-compensation element;
   wherein the integrated circuit further comprises an optical amplifier, having a third edge and a fourth edge, configured to provide the optical signal, wherein the third edge is optically coupled to the first edge;
   wherein the optical amplifier comprises another reflector optically coupled to the fourth edge; and
   wherein the optical amplifier is disposed on another substrate that is different than the substrate.

9. The integrated circuit of claim 8, wherein the optical coupling of the third edge and the first edge comprises one of: edge coupling and vertical coupling.

10. The integrated circuit of claim 8, wherein the temperature-compensation element is further configured to compensate for a temperature dependence of an index of refraction of the optical amplifier.

11. The integrated circuit of claim 8, wherein the other substrate comprises a III-V semiconductor.

12. The integrated circuit of claim 8, wherein the other reflector comprises a mirror.

13. The integrated circuit of claim 1, wherein the substrate comprises silicon, the buried-oxide layer comprises silicon dioxide, and the semiconductor layer comprises silicon.

14. A hybrid optical source, comprising:
   an integrated circuit, wherein the integrated circuit comprises:
      a substrate;
      a buried-oxide layer disposed on the substrate; and
      a semiconductor layer disposed on the buried-oxide layer, wherein the integrated circuit comprises:

an optical waveguide, defined in the semiconductor layer and having a first edge and a second edge, configured to convey an optical signal;

a temperature-compensation element, optically coupled to the optical waveguide at the second edge, configured to compensate for a temperature dependence of indexes of refraction of the optical waveguide; and a reflector, with a peak reflection wavelength having a reduced temperature sensitivity, defined in the semiconductor layer and optically coupled to the temperature-compensation element, configured to reflect a portion of the optical signal and transmit a remainder of the optical signal; and an optical amplifier, having a third edge and a fourth edge, configured to provide the optical signal, wherein the third edge is optically coupled to the first edge;

wherein the optical amplifier comprises another reflector optically coupled to the fourth edge; and wherein the optical amplifier is disposed on another substrate that is different than the substrate.

15. The hybrid optical source of claim 14, wherein the reflector comprises a grating reflector; and wherein the reflector comprises a titanium-dioxide cladding layer.

16. The hybrid optical source of claim 14, wherein the temperature-compensation element comprises a titanium-dioxide optical waveguide.

17. The hybrid optical source of claim 14, wherein the integrated circuit further comprises a first taper region between the optical waveguide and the temperature-compensation element, and a second taper region between the temperature-compensation element and the reflector; and wherein the first taper region and the second taper region provide adiabatic optical coupling.

18. The hybrid optical source of claim 14, wherein the temperature-compensation element is further configured to compensate for a temperature dependence of an index of refraction of the optical amplifier.

19. The hybrid optical source of claim 14, wherein the other substrate comprises a III-V semiconductor.

20. A method for providing an optical signal having a wavelength, the method comprising:

outputting an optical signal having a range of wavelengths from an optical amplifier;

optically coupling the optical signal to an integrated circuit;

conveying the optical signal in an optical waveguide in the integrated circuit;

temperature-compensating an index of refraction of a temperature-compensation element in the integrated circuit, wherein the temperature-compensation element is included in a portion of the optical waveguide, and wherein the temperature-compensation element compensates for a temperature dependence of indexes of refraction of the optical amplifier and the optical waveguide; and reflecting a portion of the optical signal and transmitting a remainder of the optical signal after the temperature-compensation element, wherein the reflecting involves a reflector included in the optical waveguide, and wherein the reflector has a peak reflection wavelength with a reduced temperature sensitivity.

* * * * *